United States Patent
Konishi et al.

(10) Patent No.: US 7,640,124 B2
(45) Date of Patent: Dec. 29, 2009

(54) DELAY FAILURE TEST CIRCUIT

(75) Inventors: Hideaki Konishi, Kawasaki (JP); Ryuji Shimizu, Kawasaki (JP); Masayasu Hojo, Kawasaki (JP); Haruhiko Abe, Kawasaki (JP); Satoshi Masuda, Kawasaki (JP); Naofumi Kobayashi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/717,769

(22) Filed: Mar. 14, 2007

(65) Prior Publication Data

US 2007/0288184 A1 Dec. 13, 2007

(30) Foreign Application Priority Data

Mar. 15, 2006 (JP) .............................. 2006-071333

(51) Int. Cl.
*G01R 29/02* (2006.01)
(52) U.S. Cl. .......................... 702/79; 714/726; 714/727; 714/731; 714/742; 714/730; 713/501; 713/502; 713/503
(58) Field of Classification Search .................. 702/79; 714/724, 726, 727, 729, 731, 742, 730; 713/500, 713/501, 502, 503
See application file for complete search history.

(56) References Cited

U.S. PATENT DOCUMENTS

| | | | | |
|---|---|---|---|---|
| 6,058,496 A * | 5/2000 | Gillis et al. | ................... | 714/727 |
| 6,442,722 B1 * | 8/2002 | Nadeau-Dostie et al. | ..... | 714/731 |
| 6,877,123 B2 * | 4/2005 | Johnston et al. | ............. | 714/731 |
| 6,996,759 B2 * | 2/2006 | Price | ........................... | 714/726 |
| 7,155,651 B2 * | 12/2006 | Nadeau-Dostie et al. | ..... | 714/731 |
| 2002/0136064 A1 * | 9/2002 | Yoshiyama | ............ | 365/189.05 |
| 2003/0115524 A1 * | 6/2003 | Johnston et al. | ............. | 714/726 |
| 2005/0229056 A1 * | 10/2005 | Rohrbaugh et al. | ......... | 714/726 |
| 2005/0240790 A1 * | 10/2005 | Nadeau-Dostie et al. | ..... | 713/400 |
| 2006/0026476 A1 * | 2/2006 | Nishida | ...................... | 714/730 |
| 2008/0010572 A1 * | 1/2008 | Sul | ............................. | 714/731 |
| 2008/0010573 A1 * | 1/2008 | Sul | ............................. | 714/731 |

FOREIGN PATENT DOCUMENTS

JP 2004-538466 12/2004

* cited by examiner

*Primary Examiner*—Carlos S Tsai
(74) *Attorney, Agent, or Firm*—Staas & Halsey LLP

(57) ABSTRACT

In a delay failure test circuit, a delay failure test between two clock domains among a plurality of clock domains having different operation clock rates is performed. The delay failure test circuit inputs, to a first clock domain, a clock signal having only a launch edge for transferring data from the first clock domain to a second clock domain, and to input, to the second clock domain, a clock signal having only a capture edge for capturing the data.

6 Claims, 12 Drawing Sheets

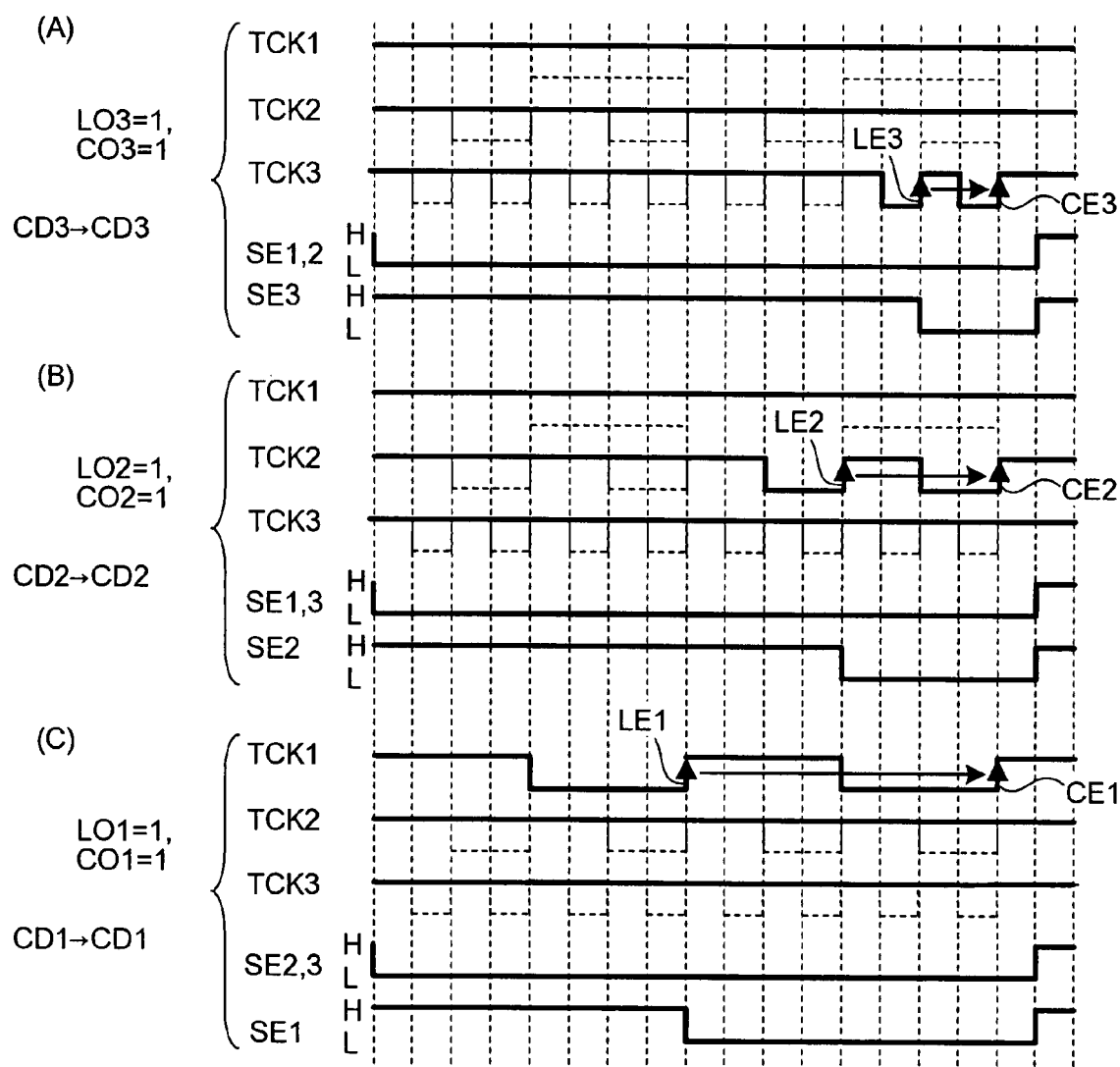

DELAY FAILURE TEST CIRCUIT

CROSS-REFERENCE TO RELATED APPLICATIONS

This application is based upon and claims the benefit of priority from the prior Japanese Patent Application No. 2006-071333, filed on Mar. 15, 2006, the entire contents of which are incorporated herein by reference.

BACKGROUND OF THE INVENTION

1. Field of the Invention

The present invention relates to a delay failure test circuit that detects a delay failure between clock domains in a tested circuit such as large scale integration (LSI).

2. Description of the Related Art

Recently, it has become increasingly important in shipment tests of LSI to detect a delay failure in addition to a stuck-at failure. To improve a detection rate of the delay failure, it is important to detect the delay failure between clock domains.

If a pattern for detecting a delay failure is generated in a conventional test pattern generating technology, first, a capture clock and a clock on the launch side are analyzed in a tested circuit. If the clocks on the launch side and the capture side are the same clocks, the test pattern can be easily generated. If the clocks on the launch side and the capture side are different, it is difficult to generate the test pattern because timing of the clocks must be considered.

FIG. 1 is a circuit diagram of LSI including a conventional delay failure test circuit. In FIG. 1, LSI 1100 is a tested circuit that includes plural clock domains CD (CD1 to CD3 in the example shown in FIG. 1) and a delay failure test circuit 1101 that detects delay failures of the clock domains CD (CD1 to CD3).

The delay failure test circuit 1101 includes a clock source CLK, a reset input terminal R, and a scan mode input terminal SM. Frequency dividing circuits div1 to div3 and selectors 1111 to 1113 are also included for the clock domains CD1 to CD3, respectively. As shown in FIG. 1, the same characters are added to input/output terminals and signals input/output to/from the input/output terminals.

A clock signal CLK is input to each of the frequency dividing circuits div1 to div3 and to each of the selectors 1111 to 1113. A reset signal R is inverted and input to each of the frequency dividing circuits div1 to div3. A scan mode signal SM is input to each of the selectors 1111 to 1113.

Each of the frequency dividing circuits div1 to div3 divides the incoming clock signal CLK. As shown in FIG. 2, when the clock signal CLK is a reference clock signal, the clock signal CLK is divided into N frequency-divided clocks (N is a real number). For example, the frequency dividing circuit div1 divides the clock signal CLK to generate ⅛ frequency and outputs a frequency-divided clock signal CLK1 (=⅛ CLK).

The frequency dividing circuit div2 divides the clock signal CLK to generate ¼ frequency and outputs a frequency-divided clock signal CLK2 (=¼ CLK). The frequency dividing circuit div3 divides the clock signal CLK to generate ½ frequency and outputs a frequency-divided clock signal CLK3 (=½ CLK).

At the subsequent stage to the frequency dividing circuits div1 to div3, the selectors 1111 to 1113 are connected respectively. The frequency-divided clock signals CLK1 to CLK3 are input from the frequency dividing circuits div1 to div3 at the preceding stage to the selectors 1111 to 1113, respectively. The clock signal CLK is also input to each of the selectors 1111 to 1113. Each of the selectors 1111 to 1113 selects an output clock signal based on the scan mode signal SM.

Specifically, if the scan mode signal SM is input, each of the selectors 1111 to 1113 outputs the clock signal CLK. On the other hand, if the scan mode signal SM is not input, the selectors 1111 to 1113 outputs the frequency-divided clock signals CLK1 to CLK3 from the frequency dividing circuits div1 to div3 at the preceding stage, respectively.

At the subsequent stage to the selectors 1111 to 1113, the clock domains CD1 to CD3 are connected via clock buffers 1121 to 1123 respectively. In other words, the frequency-divided clock signals CLK1 to CLK3 output from the selectors 1111 to 1113 are input to the clock domains CD1 to CD3 via the clock buffers 1121 to 1123, respectively.

In such LSI 1100, the following three types of data transfer are possible:

(1) data transfer between the clock domains CD1 and CD2 (an arrow A of FIG. 1);

(2) data transfer between the clock domains CD2 and CD3 (an arrow B of FIG. 1); and (3) data transfer between the clock domains CD1 and CD3 (an arrow C of FIG. 1).

To detect a delay failure in the LSI 1100, two edges, i.e., launch/capture edges must be put in a one-on-one relationship. The launch edge is a clock serving as timing of outputting data and the capture edge is a clock serving as timing of capturing the output data.

FIG. 2 is a timing chart of the clock signal CLK and the frequency-divided clock signals CLK1 to CLK3 at the time of the failure detection of the LSI 1100. With regard to the data transfer from the clock domain CD3 to the clock domain CD1, the clock must be switched from the frequency-divided clock signal CLK3 to the frequency-divided clock signal CLK1 to achieve the data transfer.

Specifically, until a clock of a second cycle ((2) of CLK1) is input for the frequency-divided clock signal CLK1, clocks of four cycles ((1) to (4) of CLK3) are input for the frequency-divided clock signal CLK3.

That is, since four launch edges ((1) to (4) of CLK3) exist corresponding to one capture edge ((2) of CLK1) in this case, the launch edges and the capture edge are not put in the one-on-one corresponding relationship.

Therefore, for example, a test pattern for detecting a delay failure cannot be generated if data launched at the clock ((4) of CLK3) of the fourth cycle of the frequency-divided clock signal CLK3 are captured at the capture edge ((2) of CLK1) of the frequency-divided clock signal CLK1 ("a" in FIG. 2).

On the other hand, with regard to the data transfer from the clock domain CD1 to the clock domain CD3, the clock must be switched from the frequency-divided clock signal CLK1 to the frequency-divided clock signal CLK3 to achieve the data transfer.

As is the case with the above description, capture edges ((2) to (7) of CLK3) are generated in the frequency-divided clock signal CLK3 corresponding to the launch edge ((1) of CLK1) of the frequency-divided clock signal CLK1. Therefore, a delay failure cannot be detected at a position actually desired (e.g., "b" in FIG. 2).

To eliminate this problem, a delay failure test circuit is suggested which aligns rising edges of plural clock domains (e.g., Published Japanese Translation of PCT Application No. 2004-538466).

However, according to the conventional technology of Published Japanese Translation of PCT Application No. 2004-538466, an influence of signal change among plural first pulses (e.g., an influence of a signal change between a first pulse of clkout(1) and a first pulse of clkout(0) or last-clkout) must be considered at the time of the generation of the test pattern. Therefore, since plural clocks are operated at the same time, all circuits become targets of the test and the generation of the test pattern becomes complicated.

SUMMARY OF THE INVENTION

It is an object of the present invention to at least solve the above problems in the conventional technologies.

With a delay failure test circuit according to one aspect of the present invention, a delay failure test between two clock domains among a plurality of clock domains having different operation clock rates is performed. The delay failure test circuit is configured to input, to a first clock domain, a clock signal having only a launch edge for transferring data from the first clock domain to a second clock domain, and to input, to the second clock domain, a clock signal having only a capture edge for capturing the data.

With a delay failure test circuit according to another aspect of the present invention, a delay failure test within a clock domain among a plurality of clock domains having different operation clock rates is performed. The delay failure test circuit is configured to generate only a launch edge and a capture edge from an operation clock of the clock domain, to mask an operation clock of other clock domains, and to input, to the clock domain, a clock signal having the launch edge and the capture edge.

The other objects, features, and advantages of the present invention are specifically set forth in or will become apparent from the following detailed description of the invention when read in conjunction with the accompanying drawings.

BRIEF DESCRIPTION OF THE DRAWINGS

FIGS. 12A to 12C are timing charts of waveforms at the time of the verification of the switching in the operation of MODE 3.

DETAILED DESCRIPTION OF THE PREFERRED EMBODIMENTS

Exemplary embodiments of the present invention will be explained in detail below with reference to the accompanying drawings. In the embodiments, the same characters are added to input/output terminals and signals input/output to/from the input/output terminals. For example, in FIG. 3, CLK represents both a clock source and a clock signal from the clock source.

Figure 1:
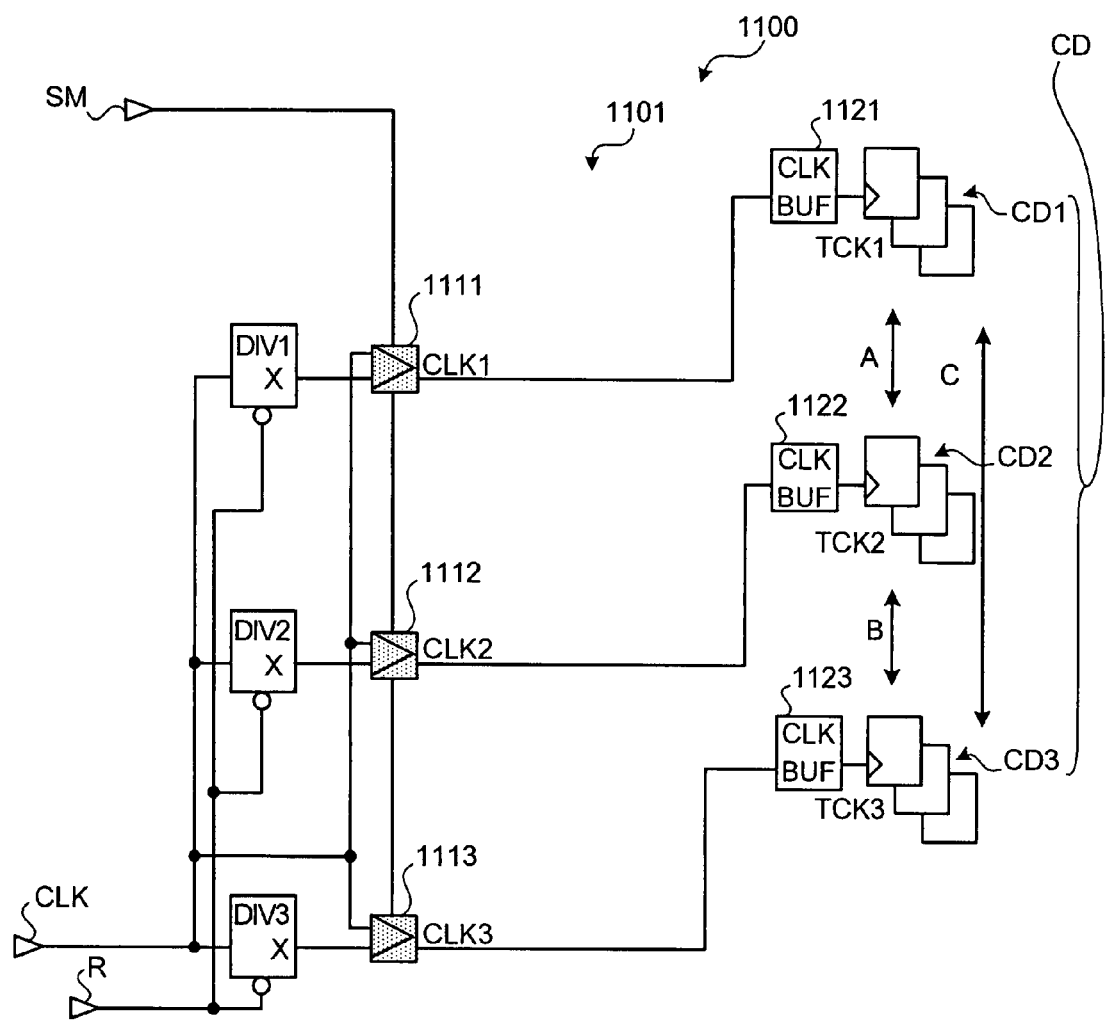
FIG. 1 is a circuit diagram of LSI including the conventional delay failure test circuit.
Figure 2:
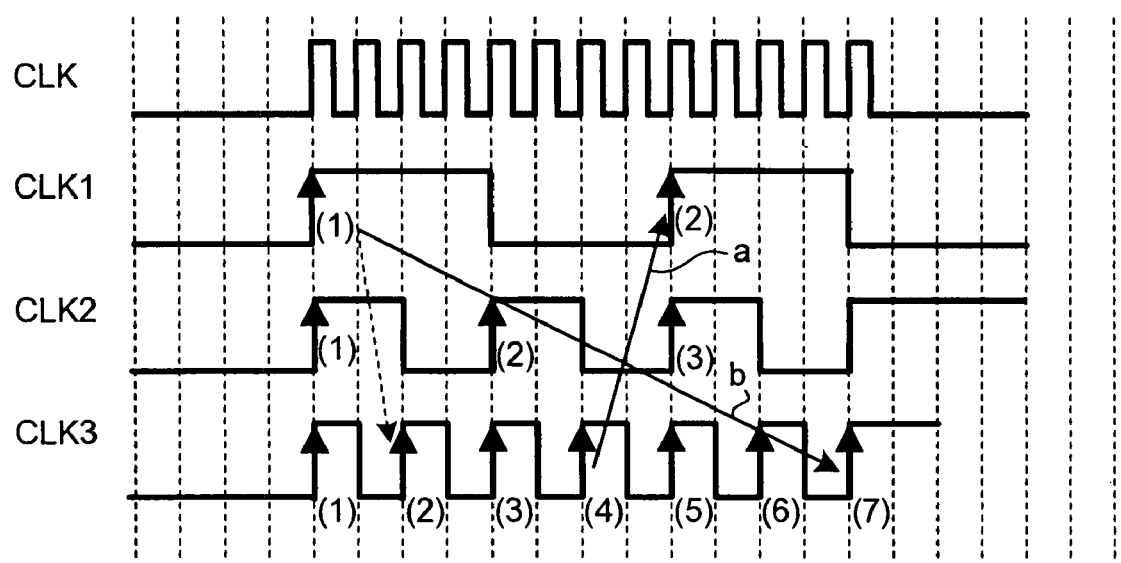
FIG. 2 is a timing chart of the clock signal CLK and the frequency-divided clock signals CLK1 to CLK3 at the time of the failure detection of the LSI including the conventional delay failure test circuit.
Figure 3:
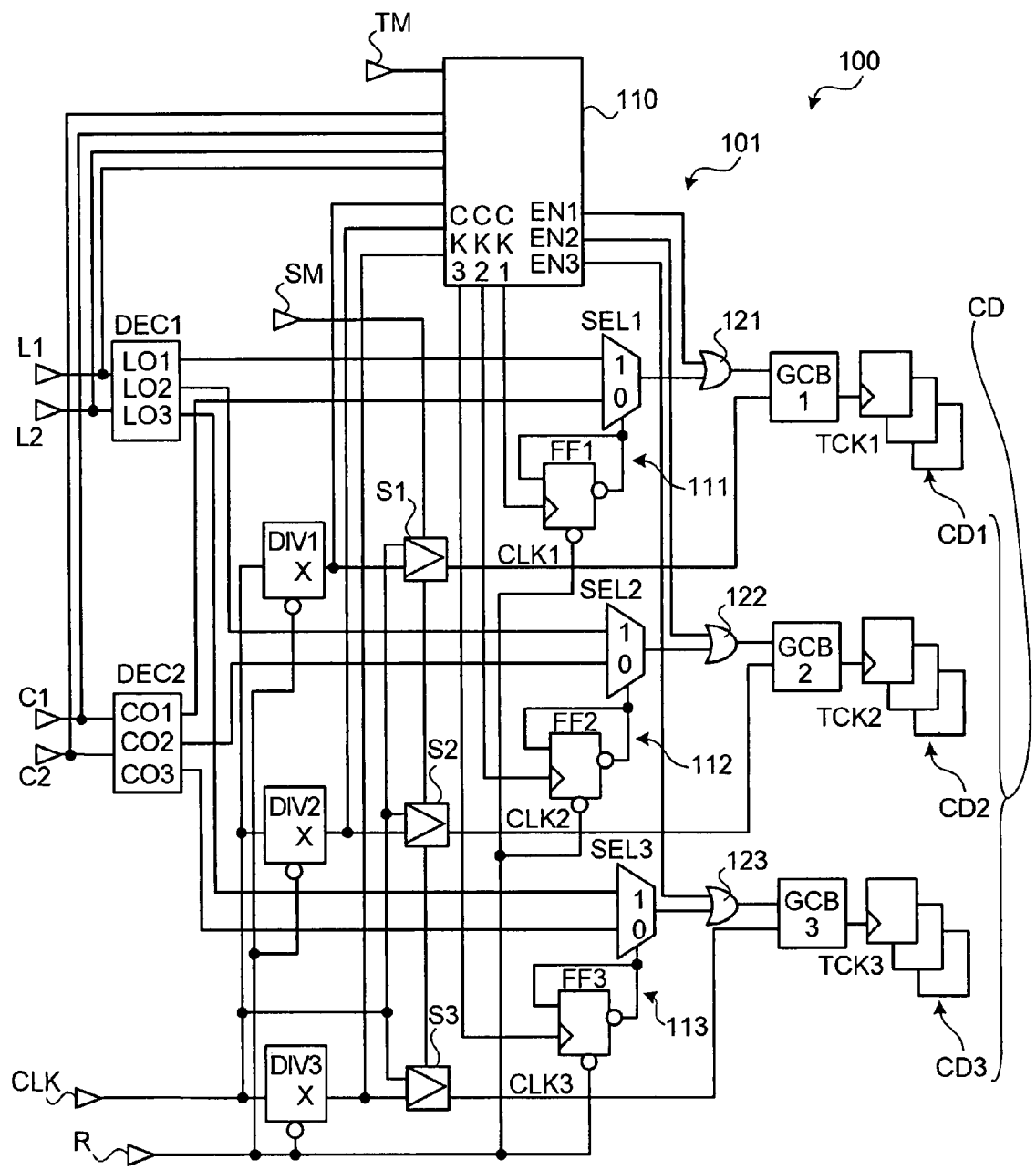
FIG. 3 is a circuit diagram of LSI including the delay failure test circuit according to the first embodiment of the present invention.

FIG. 3 is a circuit diagram of LSI including a delay failure test circuit according to a first embodiment of the present invention. In FIG. 3, LSI 100 is a tested circuit that includes plural (in the example shown in FIG. 3, three) clock domains CD (CD1 to CD3) and a delay failure test circuit 101 that detects failures of the clock domains CD (CD1 to CD3).

The delay failure test circuit 101 includes the clock source CLK, a reset input terminal R, and a scan mode input terminal SM, two launch input terminals L1, L2, two capture input terminals C1, C2, a test mode input terminal TM, a launch side decoder DEC1, a capture side decoder DEC2, and a control circuit 110.

The delay failure test circuit 101 also includes frequency dividing circuits div1 to div3, selectors S1 to S3, high-speed selection circuits 111 to 113, an OR circuits 121 to 123, and gate clock buffers GCB1 to GCB3 for the clock domains CD1 to CD3, respectively.

The clock signal CLK is input to each of the frequency dividing circuits div1 to div3 and to each of the selectors S1 to S3. A reset signal R is inverted and input to each of the frequency dividing circuits div1 to div3. A scan mode signal SM is input to each of the selectors S1 to S3. A test mode signal TM is input to the control circuit 110.

Launch selection signals L1, L2 from the two launch input terminals L1, L2 are input to the launch side decoder DEC1 and the control circuit 110. Capture selection signals C1, C2 from the two capture input terminals C1, C2 are input to the capture side decoder DEC2 and the control circuit 110.

Each of the frequency dividing circuits div1 to div3 divides the incoming clock signal CLK. As shown in FIG. 3, when the clock signal CLK is a reference clock signal, the clock signal CLK is divided into N frequency divided clocks (N is a real number).

For example, the frequency dividing circuit div1 divides the clock signal CLK to generate ⅛ frequency and outputs a frequency-divided clock signal CLK1 (=⅛ CLK). The frequency dividing circuit div2 divides the clock signal CLK to generate ¼ frequency and outputs a frequency-divided clock signal CLK2 (=¼ CLK). The frequency dividing circuit div3 divides the clock signal CLK to generate ½ frequency and outputs a frequency-divided clock signal CLK3 (=½ CLK).

The frequency dividing circuits div1 to div3 are connected to the selectors S1 to S3 at the subsequent stage, respectively. The frequency-divided clock signals CLK1 to CLK3 are input from the frequency dividing circuits div1 to div3 at the preceding stage to the selectors S1 to S3, respectively. The clock signal CLK is also input to each of the selectors S1 to S3.

Each of the selectors S1 to S3 selects an output clock signal based on the scan mode signal SM. The frequency-divided clock signals output from the selectors S1 to S3 are input to the gate clock buffers GCB1 to GCB3, respectively.

Specifically, if the scan mode signal SM is input, each of the selectors S1 to S3 outputs the clock signal CLK. On the other hand, if the scan mode signal SM is not input, the selectors S1 to S3 outputs the frequency-divided clock signal CLK1 to CLK3 from the frequency dividing circuits div1 to div3 at the preceding stage, respectively.

The launch side decoder DEC1 selects a launch side clock. The input of the launch side decoder DEC1 is connected to the launch input terminals L1, L2. The launch side decoder DEC1 includes launch output terminals LO1 to LO3 that are provided for the clock domains CD1 to CD3 and are connected to the high-speed selection circuits 111 to 113, respectively.

The launch side decoder DEC1 activates a single clock from the launch selection signals L1, L2 input to the launch input terminals L1, L2. An operation mode table of the launch side decoder DEC1 is as follows.

TABLE 1

| INPUT | | OUTPUT | | |
|---|---|---|---|---|
| L1 | L2 | LO1 | LO2 | LO3 |
| 0 | 0 | 0 | 0 | 0 |
| 0 | 1 | 1 | 0 | 0 |
| 1 | 0 | 0 | 1 | 0 |
| 1 | 1 | 0 | 0 | 1 |

For example, if a delay failure is tested for data transfer from the clock domain CD3 to the clock domain CD2, the clock of the clock domain CD3, i.e., the launch side (transfer source) is analyzed. To activate the frequency-divided clock signal CLK3 that is the launch clock, the launch selection signals from the launch input terminals L1, L2 are set such that the launch output terminal LO3 becomes one (in table 1, L1=1, L2=1).

The capture side decoder DEC2 selects a capture side clock. The input of the capture side decoder DEC2 is connected to the capture input terminals C1, C2. The capture side decoder DEC2 includes capture output terminals CO1 to CO3 that are provided for the clock domains CD1 to CD3 and are connected to the high-speed selection circuits 111 to 113, respectively.

The capture side decoder DEC2 activates a single clock from the capture selection signals input to the capture input terminals C1, C2. An operation mode table of the capture side decoder DEC2 is as follows.

TABLE 2

| INPUT | | OUTPUT | | |
|---|---|---|---|---|
| C1 | C2 | CO1 | CO2 | CO3 |
| 0 | 0 | 0 | 0 | 0 |
| 0 | 1 | 1 | 0 | 0 |
| 1 | 0 | 0 | 1 | 0 |
| 1 | 1 | 0 | 0 | 1 |

For example, if a delay failure is tested for data transfer from the clock domain CD3 to the clock domain CD2, the clock of the clock domain CD2, i.e., the capture side (transfer destination) is analyzed. To activate the frequency-divided clock signal CLK2 that is the launch clock, the capture selection signals from the capture input terminals C1, C2 are set such that the capture output terminal CO2 becomes one (in table 2, C1=1, C2=0).

The control circuit 110 decodes the launch/capture clock from each selection signal from the launch input terminals L1, L2 and the capture input terminals C1, C2 to generate clock signals CK1 to CK3 and mask signals EN1 to EN3 necessary for the failure detection. The generated clock signals CK1 to CK3 are input to the high-speed selection circuits 111 to 113, respectively. The mask signals EN1 to EN3 are input to the OR circuits 121 to 123, respectively.

The mask signals EN1 to EN3 are signals that mask the frequency-divided clock signals CLK1 to CLK3, respectively. That is, the mask signals EN1 to EN3 are signals for masking such that a two-clock pulse is generated in respective clock domains CD1 to CD3.

Specifically, while the mask signals EN1 to EN3 are rising (H-state), the respective frequency-divided clock signals CLK1 to CLK3 are masked and the clocks are not generated. On the other hand, while the mask signals EN1 to EN3 are falling (L-state), the respective frequency-divided clock signals CLK1 to CLK3 are released from the masking and are activated. The following table 3 is an operation mode table of the control circuit 110.

| INPUT | | | | OUTPUT | |
|---|---|---|---|---|---|
| L1 | L2 | C1 | C2 | EN1, 2, 3 | CK1, 2, 3 |
| 0 | 0 | 0 | 0 | | |
| 0 | 1 | 0 | 1 | | MODE 3 |
| 1 | 0 | 0 | 1 | | MODE 2 |
| 1 | 1 | 0 | 1 | | MODE 2 |
| 0 | 1 | 1 | 0 | | MODE 1 |
| 1 | 0 | 1 | 0 | | MODE 3 |
| 1 | 1 | 1 | 0 | | MODE 2 |
| 0 | 1 | 1 | 1 | | MODE 1 |
| 1 | 0 | 1 | 1 | | MODE 1 |
| 1 | 1 | 1 | 1 | | MODE 3 |

In the above operation mode table, a "MODE 1" is an operation mode when verifying a switching position from a clock domain of a relatively slow clock to a clock domain of a fast clock. As shown in FIG. 3, the verification is performed for the switching positions of the clock domain CD1→the clock domain CD2, the clock domain CD2→the clock domain CD3, and the clock domain CD1→the clock domain CD3.

In the above operation mode table, a "MODE 2" is an operation mode when verifying a switching position from a clock domain of a relatively fast clock to a clock domain of a slow clock. As shown in FIG. 3, the verification is performed for the switching positions of the clock domain CD3→the clock domain CD2, the clock domain CD2→the clock in CD1, and the clock domain CD3→the clock domain CD1.

In the above operation mode table, a "MODE 3" is an operation mode when verifying the same clock domain. As shown in FIG. 3, the verification is performed for the clock domain CD1→the clock domain CD1, the clock domain CD2→the clock domain CD2, and the clock domain CD3→the clock domain CD3. Details of MODE 1 to MODE 3 are described later.

As shown in FIG. 3, the high-speed selection circuits 111 to 113 have flip-flops FF1 to FF3 and selectors SEL1 to SEL3, respectively. The clock signals CK1 to CK3 are input to the flip-flops FF1 to FF3, respectively. The inverting outputs of the flip-flops FF1 to FF3 are input to the selectors SEL1 to SEL3 and to FF1 to FF3. The reset signal R is inverted and input to the flip-flops FF1 to FF3.

In this way, the flip-flops FF1 to FF3 are toggled by the clock signals CK1 to CK3 corresponding to the clock domain CD1 to CD3 and generate launch/capture switching signals.

The generated launch/capture switching signals switch the launch edge/capture edge active signals LO1 to LO3, CO1 to CO3 input to the selectors SEL1 to SEL3 at the subsequent stage.

The selectors SEL1 to SEL3 switch the active signals LO1 to LO3 of the launch side decoder DEC1 and the active signals CO1 to CO3 of the capture side decoder DEC2, respectively, based on the respective launch/capture switching signals from the flip-flops FF1 to FF3. That is, the active signals output from the selectors SEL1 to SEL3 are mask signals for generating the clock with the launch/capture switching signals only for the clock domains that need the launch/capture.

Specifically, to the selector SEL1, the active signal LO1 is input from the launch side decoder DEC1 and the active signal CO1 is input from the capture side decoder DEC2. One of the input active signals is selected with the launch/capture switching signal from the flip-flop FF1 and is output to the OR circuit 121 at the subsequent stage.

For example, if the launch/capture switching signal is "1", the active signal LO1 is selected and output to the OR circuit 121. On the other hand, if the launch/capture switching signal is "0", the active signal CO1 is selected and output to the OR circuit 121.

To the selector SEL2, the active signal LO2 is input from the launch side decoder DEC1 and the active signal CO2 is input from the capture side decoder DEC2. One of the input active signals is selected with the launch/capture switching signal from the flip-flop FF2 and is output to the OR circuit 122 at the subsequent stage.

For example, if the launch/capture switching signal is "1", the active signal LO2 is selected and output to the OR circuit 122. On the other hand, if the launch/capture switching signal is "0", the active signal CO2 is selected and output to the OR circuit 122.

To the selector SEL3, the active signal LO3 is input from the launch side decoder DEC1 and the active signal CO3 is input from the capture side decoder DEC2. One of the input active signals is selected with the launch/capture switching signal from the flip-flop FF3 and is output to the OR circuit 123 at the subsequent stage.

For example, if the launch/capture switching signal is "1", the active signal LO3 is selected and output to the OR circuit 123. On the other hand, if the launch/capture switching signal is "0", the active signal CO3 is selected and output to the OR circuit 123.

Since the clock is provided for each of the clock domains CD1 to CD3 at a high speed, the high-speed selection circuits 111 to 113 are difficult to dispose within the control circuit 110 because of the restrictions of the layout. Therefore, the switching to the launch side or the capture side can be performed at speed by embedding the high-speed selection circuits 111 to 113 at the outside of the control circuit 110, especially, just before the gate clock buffers GCB1 to GCB3.

To the OR circuits 121 to 123, the active signals selected by the selectors SEL1 to SEL3 are input and the mask signals EN1 to EN3 are input from the control circuit 110. The mask signals EN1 to EN3 are output only to the clock domains CD that need the launch edge/capture edge.

To the gate clock buffers GCB1 to GCB3, the mask signals EN1 to EN3 are input from the OR circuits 121 to 123 and the frequency-divided clock signals CLK1 to CLK3 are input from the selectors S1 to S3. The clock signals TCK1 to TCK3 masked by the mask signals EN1 to EN3 are output to the clock domains CD1 to CD3, respectively.

<Operation of MODE 1>

Figure 4:
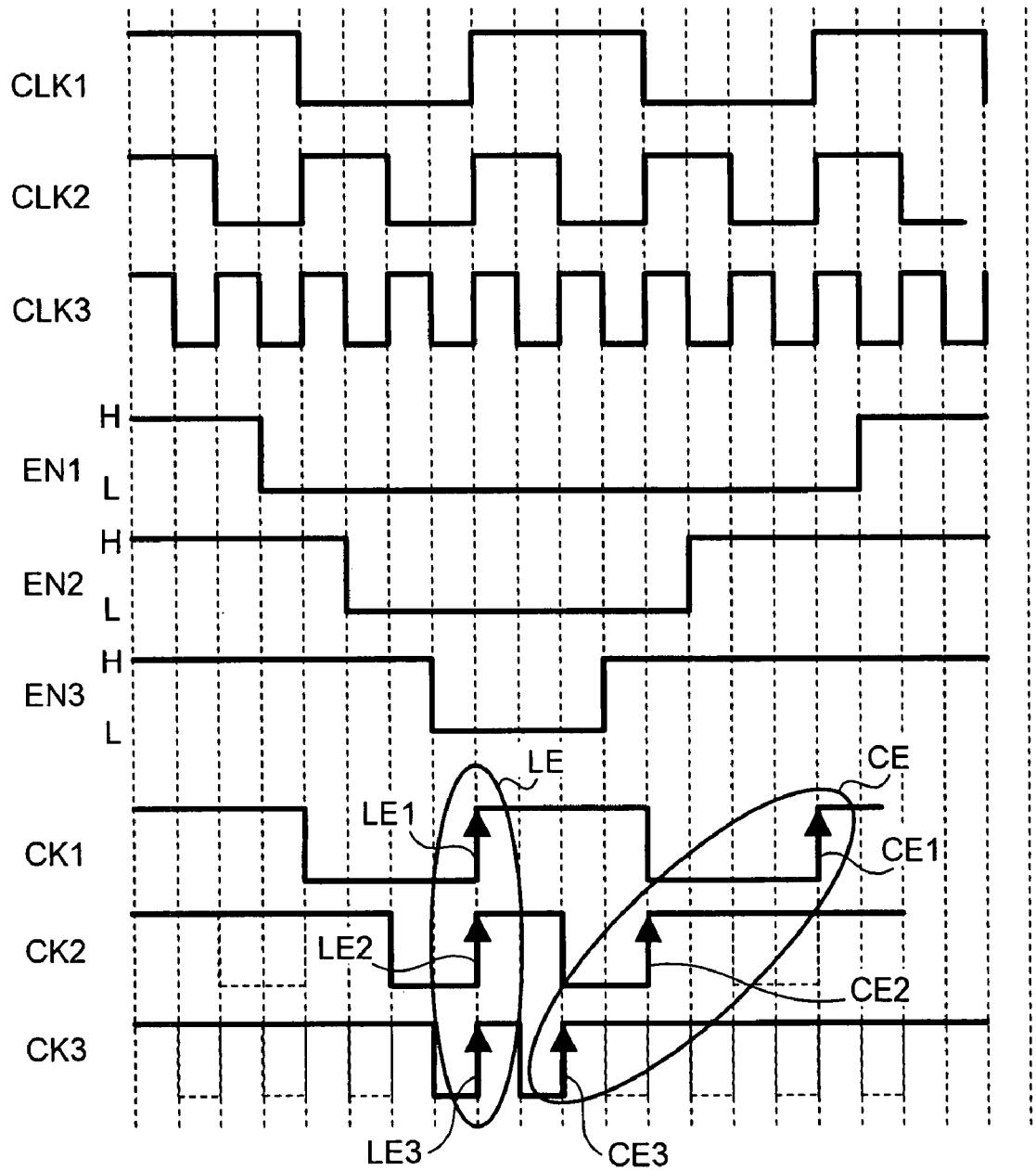
FIG. 4 is a timing chart of operation waveforms of MODE 1.

FIG. 4 is a timing chart of operation waveforms of MODE 1. The clock signal CK1 shown in FIG. 4 is a signal formed by masking the frequency-divided clock signal CLK1 with the mask signal EN1; the clock signal CK2 is a signal formed by masking the clock signal CLK2 with the mask signal EN2; and the clock signal CK3 is a signal formed by masking the frequency-divided clock signal CLK3 with the mask signal EN3.

Assuming that edges aligned at the same timing are the launch edges LE (LE1 to LE3) in the clock signals CK1 to CK3, the capture edges CE (CE1 to CE3) are the rising edges of the clocks of the next cycle.

Figure 5:
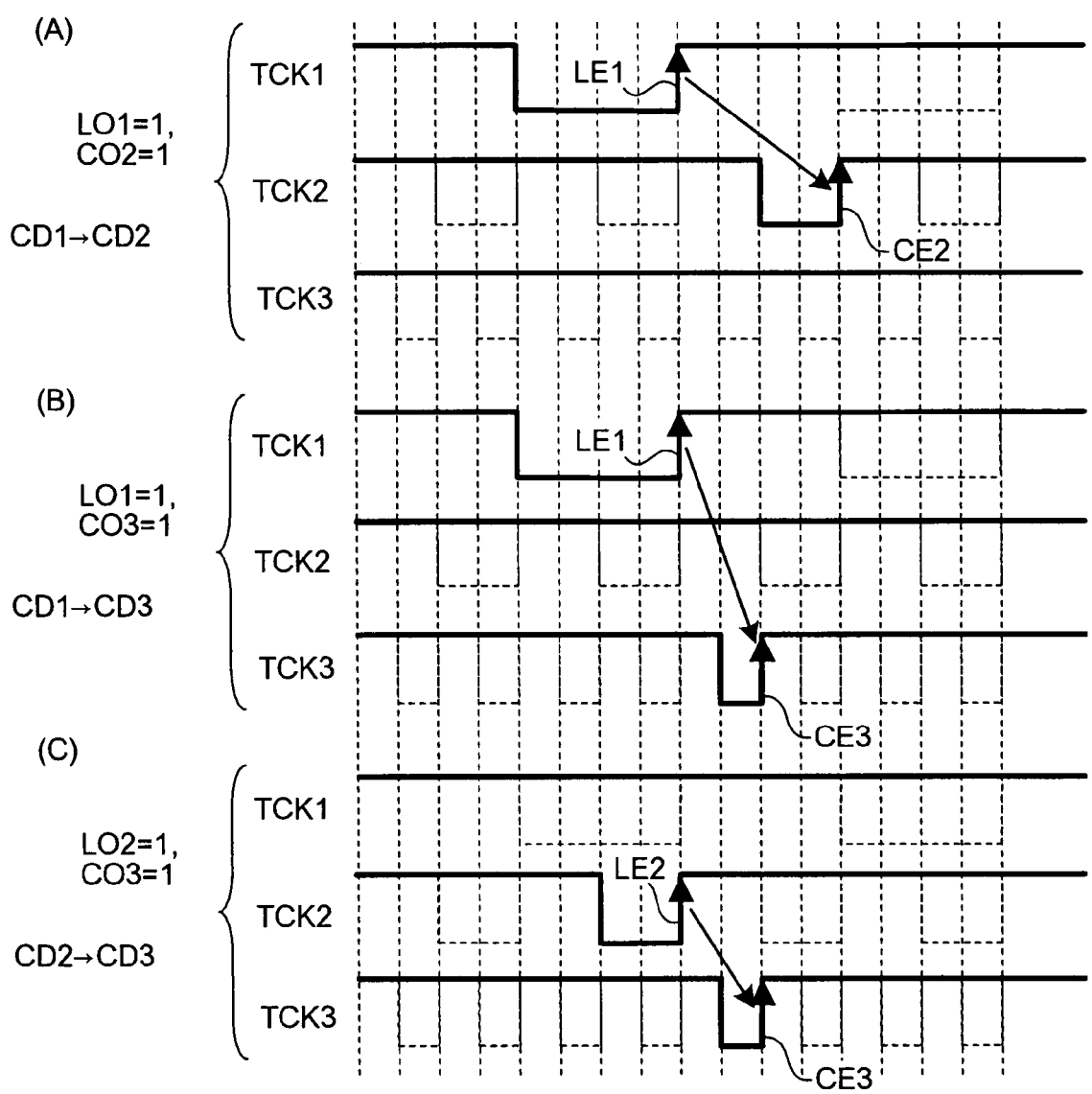
FIGS. 5A to 5C are timing charts of waveforms at the time of the verification of the switching in the operation of MODE 1.

FIGS. 5A to 5C are timing charts of waveforms at the time of the verification of the switching in the operation of MODE 1. FIG. 5A is waveforms at the time of the verification of the switching from the clock domain CD1 to the clock domain CD2 (CD1→CD2).

When verifying this switching, the output terminal LO1 of the launch side decoder DEC1 is set to LO1=1, and the output terminal CO2 of the capture side decoder DEC2 is set to CO2=1. The clock signal CLK is input to the clock source CLK in this sate to trigger the start of the delay failure test. In this way, the waveforms of FIG. 5A can be acquired.

That is, because of CO1=0, the clock signal TCK1 of FIG. 5A is a clock signal formed by masking the capture side waveform of the clock signal CK1 shown in FIG. 4.

Because of LO2=0, the clock signal TCK2 of FIG. 5A is a clock signal formed by masking the launch side waveform of the clock signal CK2 shown in FIG. 4.

Because of LO3=0 and CO3=0, the clock signal TCK3 of FIG. 5A is a clock signal formed by masking the launch side and capture side waveforms of the clock signal CK3 shown in FIG. 4.

In this way, the launch edge LE1 is generated in the clock signal TCK1 that is captured into the clock domain CD1, which is the switching source; the capture edge CE2 is generated in the clock signal TCK2 that is captured into the clock domain CD2, which is the switching destination; and other clocks are hidden.

FIG. 5B is waveforms at the time of the verification of the switching from the clock domain CD1 to the clock domain CD3 (CD1→CD3). When verifying this switching, the output terminal LO1 of the launch side decoder DEC1 is set to LO1=1, and the output terminal CO3 of the capture side decoder DEC2 is set to CO3=1. The clock signal CLK is input to the clock source CLK in this sate to trigger the start of the delay failure test. In this way, the waveforms of FIG. 5B can be acquired.

That is, because of CO1=0, the clock signal TCK1 of FIG. 5B is a clock signal formed by masking the capture side waveform of the clock signal CK1 shown in FIG. 4.

Because of LO2=0 and CO2=0, the clock signal TCK2 of FIG. 5B is a clock signal formed by masking the launch side and capture side waveforms of the clock signal CK2 shown in FIG. 4.

Because of LO3=0, the clock signal TCK3 of FIG. 5B is a clock signal formed by masking the launch side waveform of the clock signal CK3 shown in FIG. 4.

In this way, the launch edge LE1 is generated in the clock signal TCK1 that is captured into the clock domain CD1, which is the switching source; the capture edge CE3 is generated in the clock signal TCK3 that is captured into the clock domain CD3, which is the switching destination; and other clocks are hidden.

FIG. 5C is waveforms at the time of the verification of the switching from the clock domain CD2 to the clock domain CD3 (CD2→CD3). When verifying this switching, the output terminal LO2 of the launch side decoder DEC1 is set to LO2=1, and the output terminal CO3 of the capture side decoder DEC2 is set to CO3=1. The clock signal CLK is input to the clock source CLK in this sate to trigger the start of the delay failure test. In this way, the waveforms of FIG. 5C can be acquired.

That is, because of LO1=0 and CO1=0, the clock signal TCK1 of FIG. 5C is a clock signal formed by masking the launch side and capture side waveforms of the clock signal CK1 shown in FIG. 4.

Because of CO2=0, the clock signal TCK2 of FIG. 5C is a clock signal formed by masking the capture side waveform of the clock signal CK2 shown in FIG. 4.

Because of LO3=0, the clock signal TCK3 of FIG. 5C is a clock signal formed by masking the launch side waveform of the clock signal CK3 shown in FIG. 4.

In this way, the launch edge LE2 is generated in the clock signal TCK2 that is captured into the clock domain CD2, which is the switching source; the capture edge CE3 is generated in the clock signal TCK3 that is captured into the clock domain CD3, which is the switching destination; and other clocks are hidden.

In this way, when switching from a clock domain of a relatively slow clock to a clock domain of a fast clock in MODE 1, the launch edge is generated in the clock signal captured into the clock domain CD that is the switching source; the capture edge is generated in the clock signal captured into the clock domain CD that is the switching destination; and other clocks are hidden. Therefore, the combination of the launch edge LE and the capture edge CE necessary for the switching verification can be activated in a one-on-one relationship.

<Operation of MODE 2>

Figure 6:
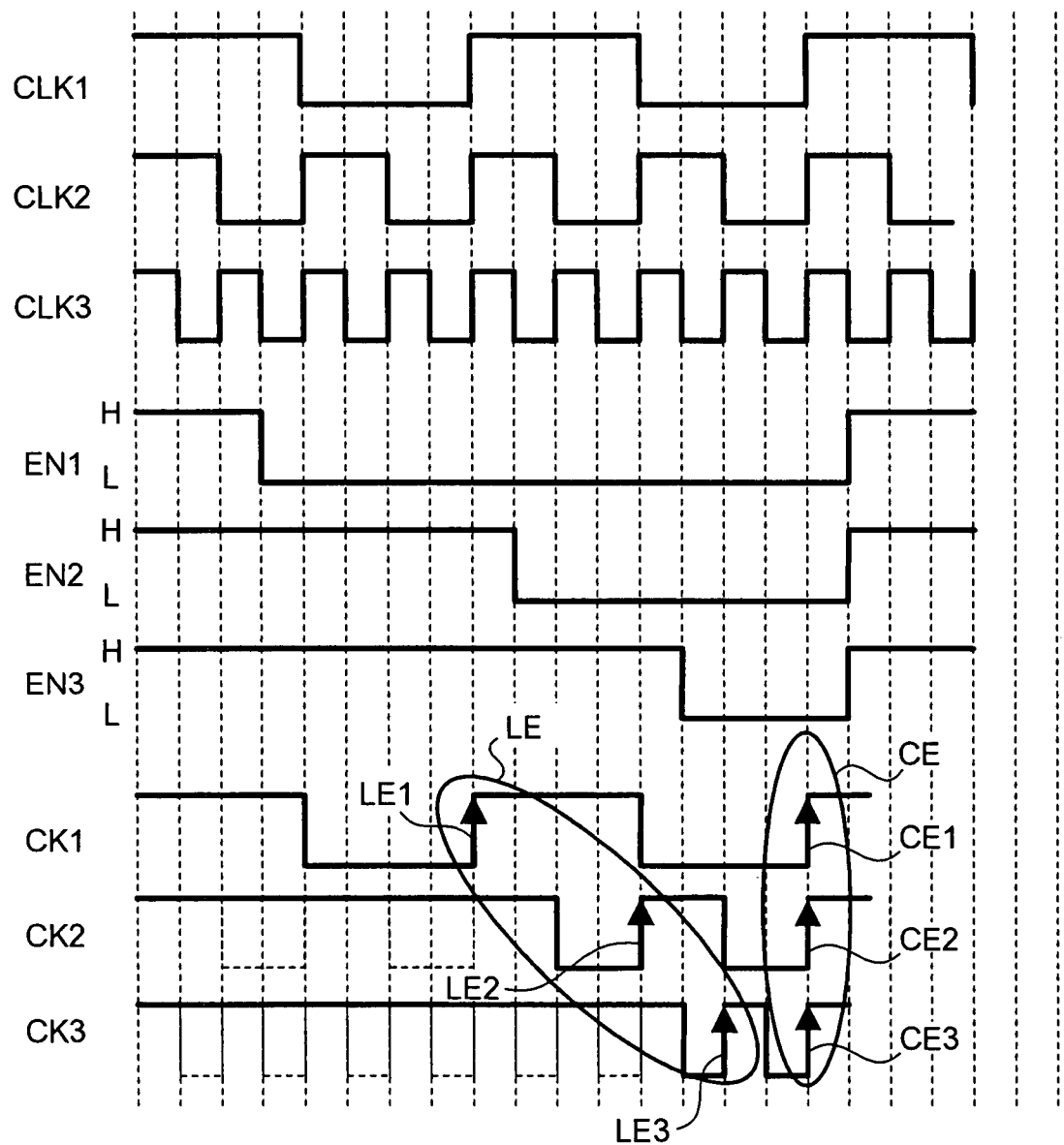
FIG. 6 is a timing chart of operation waveforms of MODE 2.

FIG. 6 is a timing chart of operation waveforms of MODE 2. The clock signal CK1 shown in FIG. 6 is a signal formed by masking the frequency-divided clock signal CLK1 with the mask signal EN1; the clock signal CK2 is a signal formed by masking the frequency-divided clock signal CLK2 with the mask signal EN2; and the clock signal CK3 is a signal formed by masking the frequency-divided clock signal CLK3 with the mask signal EN3.

Assuming that edges aligned at the same timing are the capture edges CE (CE1 to CE3) in the clock signals CK1 to CK3, the launch edges LE (LE1 to LE3) are the rising edges of the clocks of the previous cycle.

Figure 7:
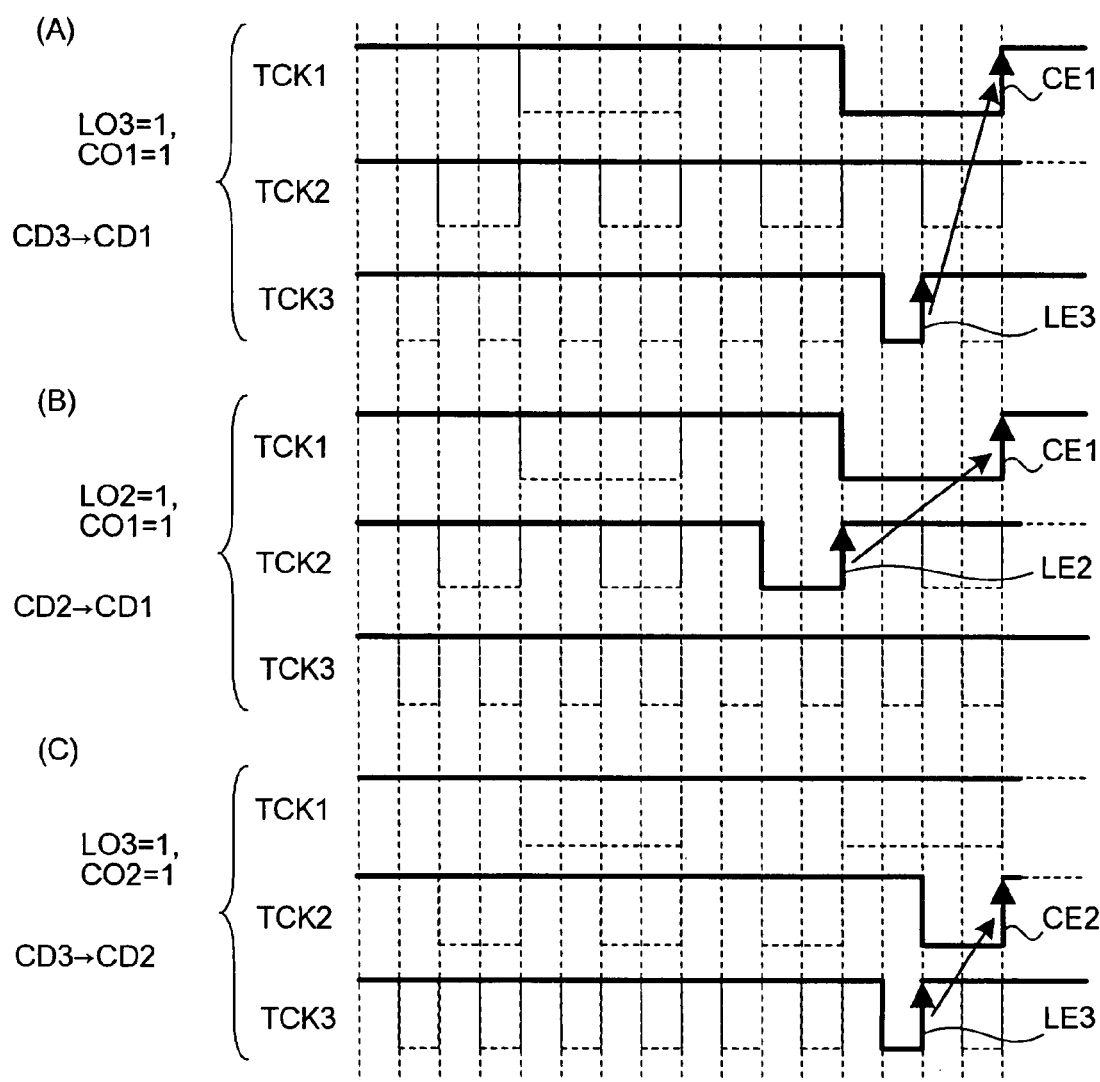
FIGS. 7A to 7C are timing charts of waveforms at the time of the verification of the switching in the operation of MODE 2.

FIGS. 7A to 7C are timing charts of waveforms at the time of the verification of the switching in the operation of MODE 2. FIG. 7A is waveforms at the time of the verification of the switching from the clock domain CD3 to the clock domain CD1 (CD3→CD1).

When verifying this switching, the output terminal LO3 of the launch side decoder DEC1 is set to LO3=1, and the output terminal CO1 of the capture side decoder DEC2 is set to CO1=1. The clock signal CLK is input to the clock source CLK in this sate to trigger the start of the delay failure test. In this way, the waveforms of FIG. 7A can be acquired.

That is, because of LO1=0, the clock signal TCK1 of FIG. 7A is a clock signal formed by masking the launch side waveform of the clock signal CK1 shown in FIG. 6.

Because of LO2=0 and CO2=0, the clock signal TCK2 of FIG. 7A is a clock signal formed by masking the launch side and capture side waveforms of the clock signal CK2 shown in FIG. 6.

Because of CO3=0, the clock signal TCK3 of FIG. 7A is a clock signal formed by masking the capture side waveform of the clock signal CK3 shown in FIG. 6.

In this way, the launch edge LE3 is generated in the clock signal TCK3 that is captured into the clock domain CD3, which is the switching source; the capture edge CE1 is generated in the clock signal TCK1 that is captured into the clock domain CD1, which is the switching destination; and other clocks are hidden.

In FIGS. 7A to 7C, FIG. 7B is waveforms at the time of the verification of the switching from the clock domain CD2 to the clock domain CD1 (CD2→CD1). When verifying this switching, the output terminal LO2 of the launch side decoder DEC1 is set to LO2=1, and the output terminal CO1 of the capture side decoder DEC2 is set to CO1=1. The clock signal CLK is input to the clock source CLK in this sate to trigger the start of the delay failure test. In this way, the waveforms of FIG. 7B can be acquired.

That is, because of LO1=0, the clock signal TCK1 of FIG. 7B is a clock signal formed by masking the launch side waveform of the clock signal CK1 shown in FIG. 6.

Because of CO2=0, the clock signal TCK2 of FIG. 7B is a clock signal formed by masking the capture side waveform of the clock signal CK2 shown in FIG. 6.

Because of LO3=0 and CO3=0, the clock signal TCK3 of FIG. 5B is a clock signal formed by masking the launch side and capture side waveforms of the clock signal CK3 shown in FIG. 6.

In this way, the launch edge LE2 is generated in the clock signal TCK2 that is captured into the clock domain CD2, which is the switching source; the capture edge CE1 is generated in the clock signal TCK1 that is captured into the clock domain CD1, which is the switching destination; and other clocks are hidden.

FIG. 7C is waveforms at the time of the verification of the switching from the clock domain CD3 to the clock domain CD2 (CD3→CD2). When verifying this switching, the output terminal LO3 of the launch side decoder DEC1 is set to LO3=1, and the output terminal CO2 of the capture side decoder DEC2 is set to CO2=1. The clock signal CLK is input to the clock source CLK in this sate to trigger the start of the delay failure test. In this way, the waveforms of FIG. 7C can be acquired.

That is, because of LO1=0 and CO1=0, the clock signal TCK1 of FIG. 7C is a clock signal formed by masking the launch side and capture side waveforms of the clock signal CK1 shown in FIG. 6.

Because of LO2=0, the clock signal TCK2 of FIG. 7C is a clock signal formed by masking the launch side waveform of the clock signal CK2 shown in FIG. 6.

Because of CO3=0, the clock signal TCK3 of FIG. 7C is a clock signal formed by masking the capture side waveform of the clock signal CK3 shown in FIG. 6.

In this way, the launch edge LE3 is generated in the clock signal TCK3 that is captured into the clock domain CD3, which is the switching source; the capture edge CE2 is generated in the clock signal TCK2 that is captured into the clock domain CD2, which is the switching destination; and other clocks are hidden.

In this way, when switching from a clock domain of a relatively fast clock to a clock domain of a slow clock in MODE 2, the launch edge LE is generated in the clock signal captured into the clock domain CD that is the switching source; the capture edge CE is generated in the clock signal captured into the clock domain CD that is the switching destination; and other clocks are hidden. Therefore, the combination of the launch edge LE and the capture edge CE necessary for the switching verification can be activated in a one-on-one relationship.

<Operation of MODE 3>

The operation waveforms of MODE 1 (see FIG. 4) or the operation waveforms of MODE 2 (see FIG. 6) may be used for the operation waveforms of MODE 3. In this description, the operation waveforms of MODE 2 shown in FIG. 6 are used.

Figure 8:
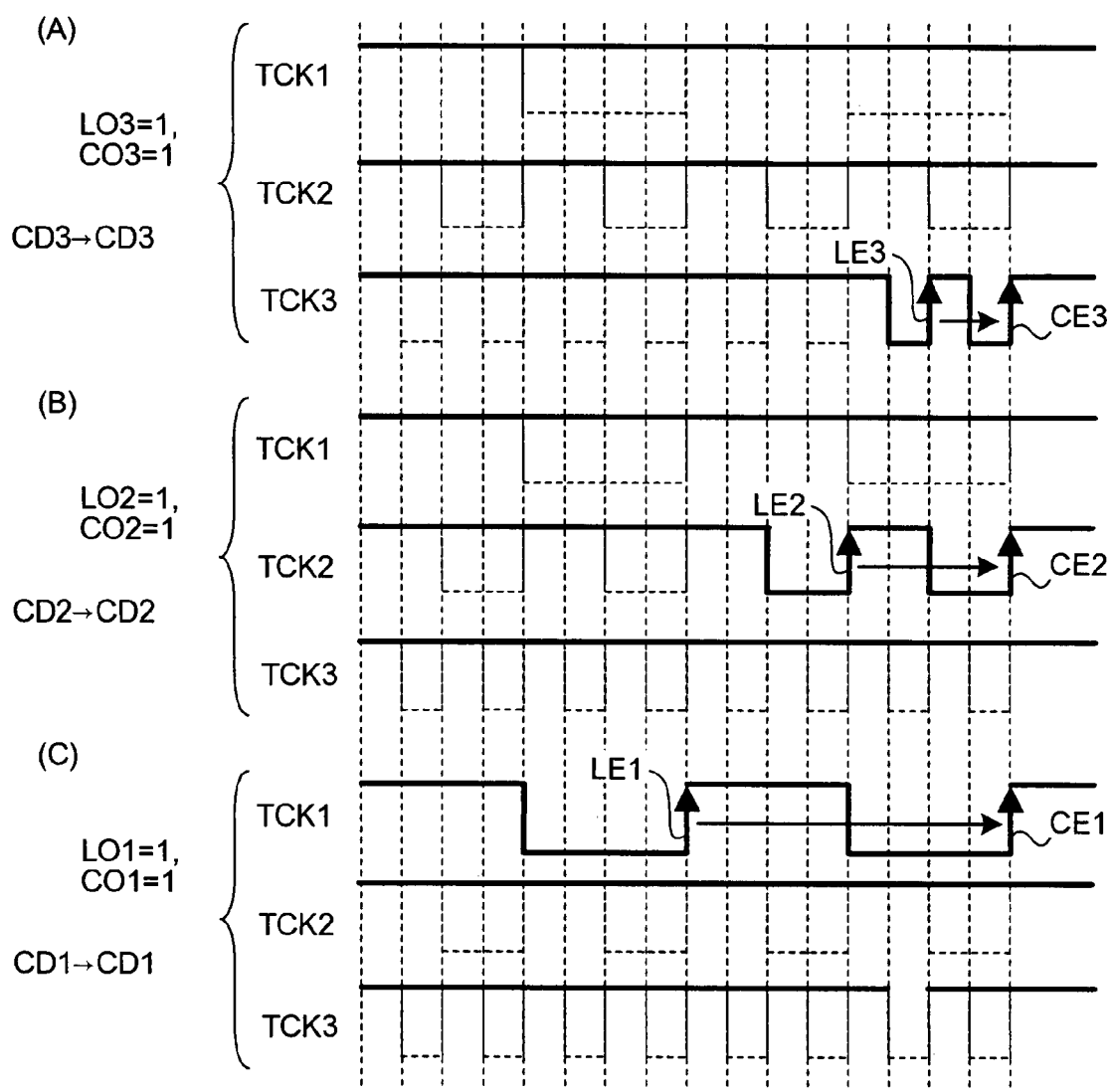
FIGS. 8A to 8C are timing charts of waveforms at the time of the verification of the switching in the operation of MODE 3.

FIGS. 8A to 8C are timing charts of waveforms at the time of the verification in the operation of MODE 3. FIG. 8A is waveforms at the time of the same-domain verification from the clock domain CD3 to the clock domain CD3 (CD3→CD3).

In the case of the same-domain verification, the output terminal LO3 of the launch side decoder DEC1 is set to LO3=1, and the output terminal CO3 of the capture side decoder DEC2 is set to CO3=1. The clock signal CLK is input to the clock source CLK in this sate to trigger the start of the delay failure test. In this way, the waveforms of FIG. 8A can be acquired.

That is, because of LO1=0 and CO1=0, the clock signal TCK1 of FIG. 8A is a clock signal formed by masking the launch side and capture side waveforms of the clock signal CK1 shown in FIG. 6.

Because of LO2=0 and CO2=0, the clock signal TCK2 of FIG. 8A is a clock signal formed by masking the launch side and capture side waveforms of the clock signal CK2 shown in FIG. 6.

Because of LO3=1 and CO3=1, the clock signal TCK3 of FIG. 8A is a clock signal formed without masking either the launch side or capture side waveforms of the clock signal CK3 shown in FIG. 6.

In this way, the launch edge LE3 is generated in the clock signal TCK3 that is captured into the clock domain CD3, which is the switching source; the capture edge CE3 is generated in the clock signal TCK3 that is captured into the clock domain CD3, which is the switching destination; and other clocks are hidden.

In FIGS. 8A to 8C, FIG. 8B is waveforms at the time of the verification of the switching from the clock domain CD2 to the clock domain CD2 (CD2→CD2). When verifying this switching, the output terminal LO2 of the launch side decoder DEC1 is set to LO2=1, and the output terminal CO2 of the capture side decoder DEC2 is set to CO2=1. The clock signal CLK is input to the clock source CLK in this sate to trigger the start of the delay failure test. In this way, the waveforms of FIG. 8B can be acquired.

That is, because of LO1=0 and CO1=0, the clock signal TCK1 of FIG. 8B is a clock signal formed by masking the launch side and capture side waveforms of the clock signal CK1 shown in FIG. 6.

Because of LO2=1 and CO2=1, the clock signal TCK2 of FIG. 8B is a clock signal formed without masking either the launch side or capture side waveforms of the clock signal CK2 shown in FIG. 6.

Because of LO3=0 and CO3=0, the clock signal TCK3 of FIG. 8B is a clock signal formed by masking the launch side and capture side waveforms of the clock signal CK3 shown in FIG. 6.

In this way, the launch edge LE2 is generated in the clock signal TCK2 that is captured into the clock domain CD2, which is the switching source; the capture edge CE2 is generated in the clock signal TCK2 that is captured into the clock domain CD2, which is the switching destination; and other clocks are hidden.

FIG. 8C is waveforms at the time of the verification of the switching from the clock domain CD1 to the clock domain CD1 (CD1→CD1). When verifying this switching, the output terminal LO1 of the launch side decoder DEC1 is set to LO1=1, and the output terminal CO1 of the capture side decoder DEC2 is set to CO1=1. The clock signal CLK is input to the clock source CLK in this sate to trigger the start of the delay failure test. In this way, the waveforms of FIG. 8C can be acquired.

That is, because of LO1=1 and CO1=1, the clock signal TCK1 of FIG. 8C is a clock signal formed without masking either the launch side or capture side waveforms of the clock signal CK1 shown in FIG. 6.

Because of LO2=0 and CO2=0, the clock signal TCK2 of FIG. 8C is a clock signal formed by masking the launch side and capture side waveforms of the clock signal CK2 shown in FIG. 6.

Because of LO3=0 and CO3=0, the clock signal TCK3 of FIG. 8C is a clock signal formed by masking the launch side and capture side waveforms of the clock signal CK3 shown in FIG. 6.

In this way, the launch edge LE1 is generated in the clock signal TCK1 that is captured into the clock domain CD1, which is the switching source; the capture edge CE1 is generated in the clock signal TCK1 that is captured into the clock domain CD1, which is the switching destination; and other clocks are hidden.

In MODE 3, the launch edge LE and the capture edge CE are generated in the clock signals captured into the same clock domain CD and other clocks are hidden. Therefore, the combination of the launch edge LE and the capture edge CE necessary for the verification of the same clock domain can be activated in a one-on-one relationship. The launch edges LE or capture edges CE may be used, provided the timing is not affected.

A second embodiment shows an example of applying a skewed load mode to the first embodiment. In the skewed load mode, when the delay failure test is performed, a clock signal for the scan shift is used as the launch edge.

Figure 9:
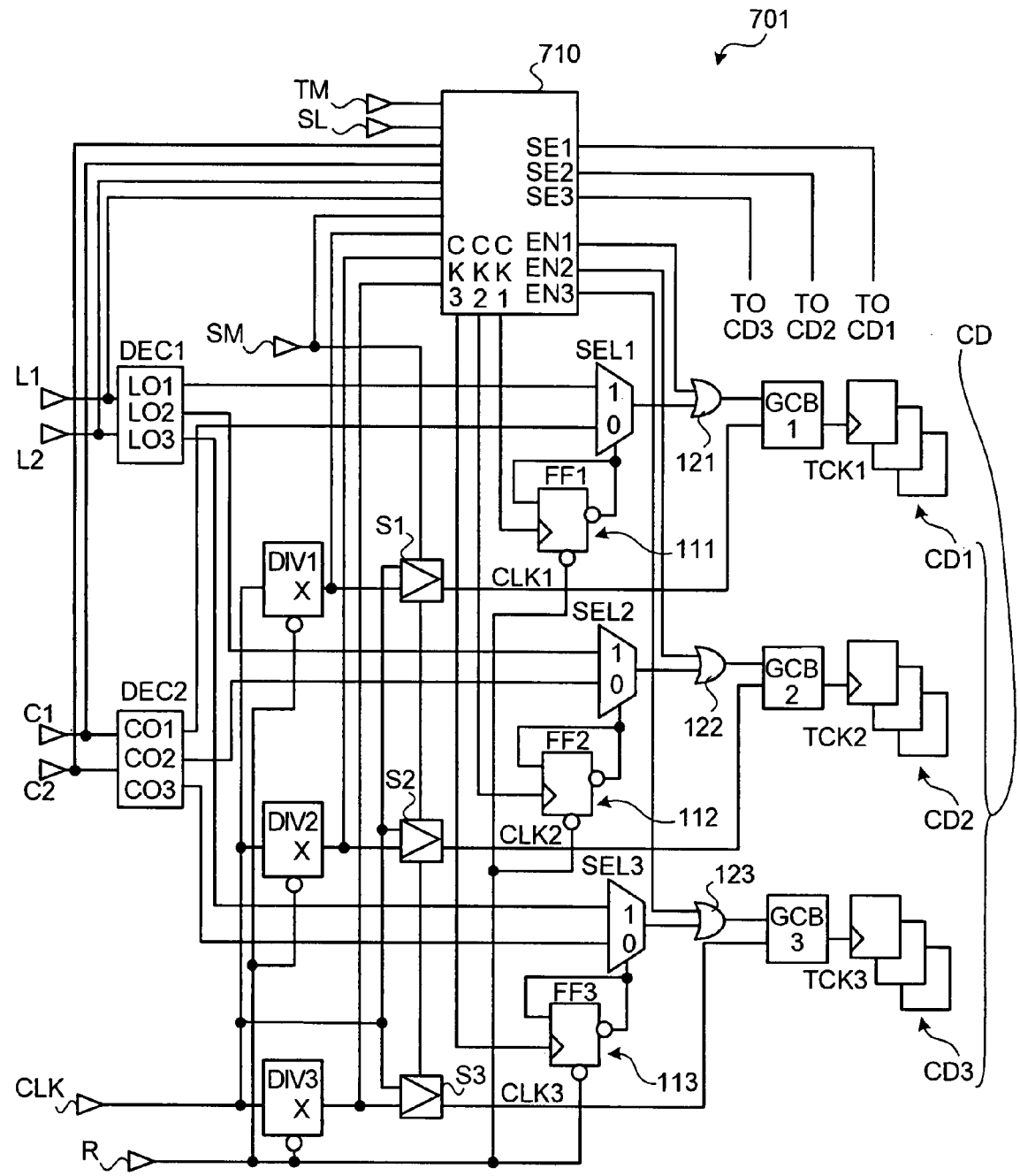
FIG. 9 is a circuit diagram of LSI including the delay failure test circuit according to the second embodiment of the present invention.

FIG. 9 is a circuit diagram of LSI including a delay failure test circuit according to the second embodiment. In FIG. 9, LSI 700 is a tested circuit that includes plural (in the example shown in FIG. 9, three) clock domains CD (CD1 to CD3) and a delay failure test circuit 701 that detects failures of the clock domains CD (CD1 to CD3).

Since the delay failure test circuit 701 has the almost same circuit configuration as the delay failure test circuit 101 shown in the first embodiment, the same characters are added to the same components and the description thereof is omitted. Since various operations are the same as the contents shown in tables 1 to 3 described above, the description thereof is omitted.

The control circuit 710 includes, in addition to each component of the control circuit 110 shown in FIG. 3, a skewed load input terminal SL and scan enable output terminals SE1 to SE3 which are provided for the clock domains CD1 to CD3, respectively.

In the skewed load mode, only for a scan flip-flop (not shown) within a clock domain CDi where a launch edge LEi (i=1 to 3) is input into, a scan enable signal SEi is changed in accordance with the launch edge LEi.

A scan enable signal SEj input to the scan flip-flop (not shown) of another clock domain CDj (j≠i) always has a polarity that constrains the shift while the clock is at a high speed (e.g., 400 [GHz]).

Specifically, the number of times of the scan shift is increased by one for the clock domain CDi where the launch edge LEi is input into. In this way, the last clock of the scan shift can be used as the launch edge LEi and the scan shift can be made in common with the launch.

In this case, the last edge of the scan shift is made close to the capture edge. Hereinafter, the operations of MODE 1 to MODE 3 shown in table 3 in the second embodiment will be described.

<Operation of MODE 1>

The operation waveforms of MODE 1 are the same as the operation waveforms shown in FIG. 4 and will not be described.

Figure 10:
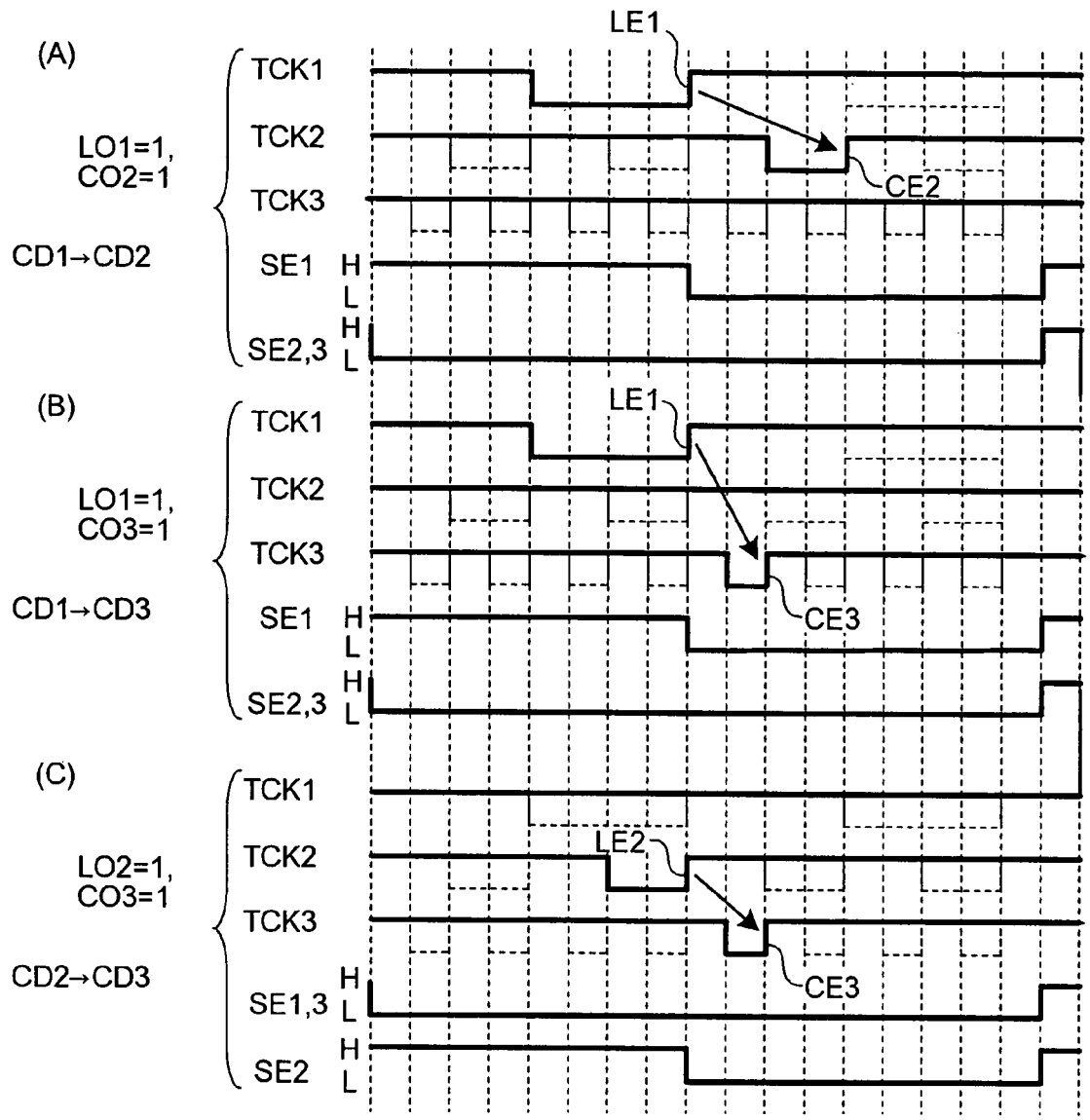
FIGS. 10A to 10C are timing charts of waveforms at the time of the verification of the switching in the operation of MODE 1.

FIGS. 10A to 10C are timing charts of waveforms at the time of the verification of the switching in the operation of MODE 1. FIG. 10A is waveforms at the time of the verification of the switching from the clock domain CD1 to the clock domain CD2 (CD1→CD2).

When verifying this switching, the output terminal LO1 of the launch side decoder DEC1 is set to LO1=1, and the output terminal CO2 of the capture side decoder DEC2 is set to CO2=1. The clock signal CLK is input to the clock source CLK in this sate at the time of the scan mode to trigger the start of the delay failure test. In this way, the waveforms shown in FIG. 10A can be acquired from the clock signals CK1 to CK3 shown in FIG. 4.

That is, because of LO1=1 in FIG. 10A, the scan enable signal SE1 becomes the H-state. An edge defined by the last clock of the scan mode becomes the launch edge LE1, and the scan enable signal SE1 is changed from the H-state to the L-state by detecting this launch edge LE1. Since the mask signal EN1 is activated while the scan enable signal SE1 is in the L-state, the clocks are masked except the launch edge LE1 of the clock signal TCK1.

Because of LO2=0 and LO3=0, the scan enable signals SE2, SE3 become the L-state. Therefore, the launch edges LE2, LE3 are not detected from the clock signals TCK2, TCK3. The mask process same as the first embodiment is performed for masking the capture edges CE.

In this way, the launch edge LE1 is generated in the clock signal CK1 that is captured into the clock domain CD1, which is the switching source; the capture edge CE2 is generated in the clock signal CK2 that is captured into the clock domain CD2, which is the switching destination; and other clocks are hidden.

FIG. 10B is waveforms at the time of the verification of the switching from the clock domain CD1 to the clock domain CD3 (CD1→CD3).

When verifying this switching, the output terminal LO1 of the launch side decoder DEC1 is set to LO1=1, and the output terminal CO3 of the capture side decoder DEC2 is set to CO3=1. The clock signal CLK is input to the clock source CLK in this sate at the time of the scan mode to trigger the start of the delay failure test. In this way, the waveforms shown in FIG. 10B can be acquired from the clock signals CK1 to CK3 shown in FIG. 4.

That is, because of LO1=1 in FIG. 10B, the scan enable signal SE1 becomes the H-state. An edge defined by the last clock of the scan mode becomes the launch edge LE1, and the scan enable signal SE1 is changed from the H-state to the L-state by detecting this launch edge LE1. Since the mask signal EN1 is activated while the scan enable signal SE1 is in the L-state, the clocks are masked except the launch edge LE1 of the clock signal TCK1.

Because of LO2=0 and LO3=0, the scan enable signals SE2, SE3 become the L-state. Therefore, the launch edges LE2, LE3 are not detected from the clock signals TCK2, TCK3. The mask process same as the first embodiment is performed for masking the capture edges CE.

In this way, the launch edge LE1 is generated in the clock signal TCK1 that is captured into the clock domain CD1, which is the switching source; the capture edge CE3 is generated in the clock signal TCK3 that is captured into the clock domain CD3, which is the switching destination; and other clocks are hidden.

FIG. 10C is waveforms at the time of the verification of the switching from the clock domain CD2 to the clock domain CD3 (CD2→CD3).

When verifying this switching, the output terminal LO2 of the launch side decoder DEC1 is set to LO2=1, and the output terminal CO3 of the capture side decoder DEC2 is set to CO3=1. The clock signal CLK is input to the clock source CLK in this sate at the time of the scan mode to trigger the start of the delay failure test. In this way, the waveforms shown in FIG. 10C can be acquired from the clock signals TCK1 to TCK3 shown in FIG. 4.

That is, because of LO2=1 in FIG. 10C, the scan enable signal SE2 becomes the H-state. An edge defined by the last clock of the scan mode becomes the launch edge LE1, and the scan enable signal SE2 is changed from the H-state to the L-state by detecting this launch edge LE2. Since the mask signal EN2 is activated while the scan enable signal SE2 is in the L-state, the clocks are masked except the launch edge LE2 of the clock signal TCK2.

Because of LO1=0 and LO3=0, the scan enable signals SE1, SE3 become the L-state. Therefore, the launch edges LE1, LE3 are not detected from the clock signals TCK1, TCK3. The mask process same as the first embodiment is performed for masking the capture edges CE.

In this way, the launch edge LE2 is generated in the clock signal TCK2 that is captured into the clock domain CD2, which is the switching source; the capture edge CE3 is generated in the clock signal TCK3 that is captured into the clock domain CD3, which is the switching destination; and other clocks are hidden.

In this way, when switching from a clock domain of a relatively slow clock to a clock domain of a fast clock in MODE 1, the launch edge is generated in the clock signal captured into the clock domain CD that is the switching source; the capture edge is generated in the clock signal captured into the clock domain CD that is the switching destination; and other clocks are hidden.

Therefore, the combination of the launch edge LE and the capture edge CE necessary for the switching verification can be activated in a one-on-one relationship. Consequently, the skewed load mode can be applied to the failure detection without considerably changing the circuit configuration.

<Operation of MODE 2>

The operation waveforms of MODE 2 are the same as the operation waveforms shown in FIG. 6 and will not be described.

Figure 11:
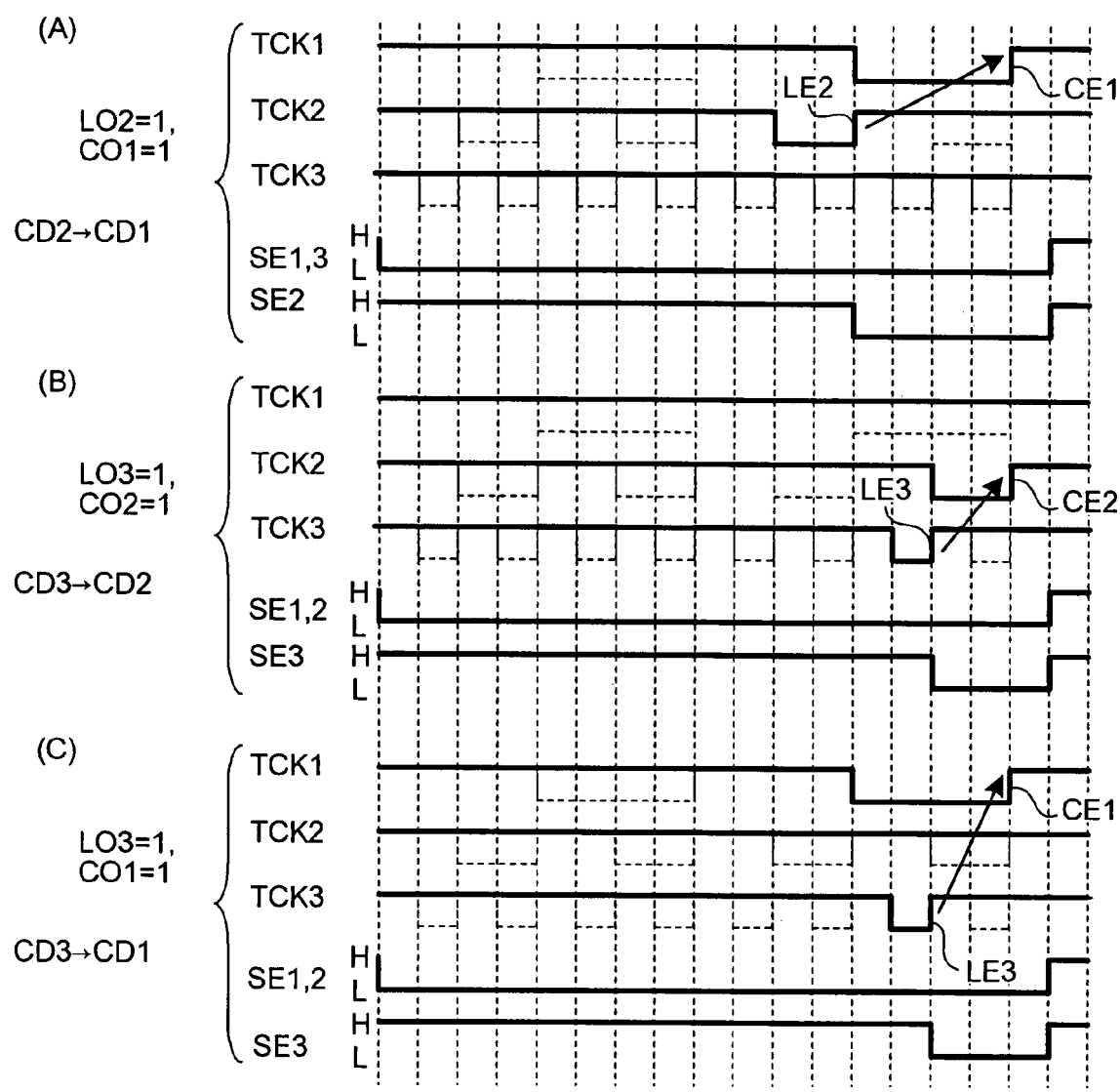
FIGS. 11A to 11C are timing charts of waveforms at the time of the verification of the switching in the operation of MODE 2.

FIGS. 11A to 11C are timing charts of waveforms at the time of the verification of the switching in the operation of MODE 2. FIG. 11A is waveforms at the time of the verification of the switching from the clock domain CD2 to the clock domain CD1 (CD2→CD1).

When verifying this switching, the output terminal LO2 of the launch side decoder DEC1 is set to LO2=1, and the output terminal CO1 of the capture side decoder DEC2 is set to CO1=1. The clock signal CLK is input to the clock source CLK in this sate at the time of the scan mode to trigger the start of the delay failure test. In this way, the waveforms shown in FIG. 11A can be acquired from the clock signals TCK1 to TCK3 shown in FIG. 6.

That is, because of LO2=1 in FIG. 11A, the scan enable signal SE2 becomes the H-state. An edge defined by the last clock of the scan mode becomes the launch edge LE2, and the scan enable signal SE2 is changed from the H-state to the L-state by detecting this launch edge LE2. Since the mask signal EN2 is activated while the scan enable signal SE2 is in the L-state, the clocks are masked except the launch edge LE2 of the clock signal TCK2.

Because of LO1=0 and LO3=0, the scan enable signals SE1, SE3 become the L-state. Therefore, the launch edges LE1, LE3 are not detected from the clock signals TCK1, TCK3. The mask process same as the first embodiment is performed for masking the capture edges CE.

In this way, the launch edge LE2 is generated in the clock signal TCK2 that is captured into the clock domain CD2, which is the switching source; the capture edge CE1 is generated in the clock signal TCK1 that is captured into the clock domain CD1, which is the switching destination; and other clocks are hidden.

FIG. 11B is waveforms at the time of the verification of the switching from the clock domain CD3 to the clock domain CD2 (CD3→CD2).

When verifying this switching, the output terminal LO3 of the launch side decoder DEC1 is set to LO3=1, and the output terminal CO2 of the capture side decoder DEC2 is set to CO2=1. The clock signal CLK is input to the clock source CLK in this sate at the time of the scan mode to trigger the start of the delay failure test. In this way, the waveforms shown in FIG. 11B can be acquired from the clock signals TCK1 to TCK3 shown in FIG. 6.

That is, because of LO3=1 in FIG. 11B, the scan enable signal SE3 becomes the H-state. An edge defined by the last clock of the scan mode becomes the launch edge LE3, and the scan enable signal SE3 is changed from the H-state to the L-state by detecting this launch edge LE3. Since the mask signal EN3 is activated while the scan enable signal SE3 is in the L-state, the clocks are masked except the launch edge LE3 of the clock signal TCK3.

Because of LO2=0 and LO1=0, the scan enable signals SE1, SE2 become the L-state. Therefore, the launch edges LE1, LE2 are not detected from the clock signals TCK1, TCK2. The mask process same as the first embodiment is performed for masking the capture edges CE.

In this way, the launch edge LE3 is generated in the clock signal TCK3 that is captured into the clock domain CD3, which is the switching source; the capture edge CE2 is generated in the clock signal TCK2 that is captured into the clock domain CD2, which is the switching destination; and other clocks are hidden.

FIG. 11C is waveforms at the time of the verification of the switching from the clock domain CD3 to the clock domain CD1 (CD3→CD1).

When verifying this switching, the output terminal LO3 of the launch side decoder DEC1 is set to LO3=1, and the output terminal CO1 of the capture side decoder DEC2 is set to CO1=1. The clock signal CLK is input to the clock source CLK in this sate at the time of the scan mode to trigger the start of the delay failure test. In this way, the waveforms shown in FIG. 11C can be acquired from the clock signals TCK1 to TCK3 shown in FIG. 6.

That is, because of LO3=1 shown in FIG. 11C, the scan enable signal SE3 becomes the H-state. An edge defined by the last clock of the scan mode becomes the launch edge LE3, and the scan enable signal SE3 is changed from the H-state to the L-state by detecting this launch edge LE3. Since the mask signal EN3 is activated while the scan enable signal SE3 is in the L-state, the clocks are masked except the launch edge LE3 of the clock signal TCK3.

Because of LO1=0 and LO2=0, the scan enable signals SE1, SE2 become the L-state. Therefore, the launch edges LE1, LE2 are not detected from the clock signals TCK1, TCK2. The mask process same as the first embodiment is performed for masking the capture edges CE.

In this way, the launch edge LE3 is generated in the clock signal TCK3 that is captured into the clock domain CD3, which is the switching source; the capture edge CE1 is generated in the clock signal TCK1 that is captured into the clock domain CD1, which is the switching destination; and other clocks are hidden.

In this way, when switching from a clock domain of a relatively fast clock to a clock domain of a slow clock in MODE 2, the launch edge LE is generated in the clock signal captured into the clock domain CD that is the switching source; the capture edge CE is generated in the clock signal captured into the clock domain CD that is the switching destination; and other clocks are hidden.

Therefore, the combination of the launch edge LE and the capture edge CE necessary for the switching verification can be activated in a one-on-one relationship. Consequently, the skewed load mode can be applied to the failure detection without considerably changing the circuit configuration.

<Operation of MODE 3>

The operation waveforms of MODE 3 are the same as the operation waveforms shown in FIG. 6 and will not be described.

FIGS. 12A to 12C are timing charts of waveforms at the time of the verification in the operation of MODE 3. FIG. 12A is waveforms at the time of the same-domain verification from the clock domain CD3 to the clock domain CD3 (CD3→CD3).

In the case of the same-domain verification, the output terminal LO3 of the launch side decoder DEC1 is set to LO3=1, and the output terminal CO3 of the capture side decoder DEC2 is set to CO3=1. The clock signal CLK is input to the clock source CLK in this sate at the time of the scan mode to trigger the start of the delay failure test. In this way, the waveforms shown in FIG. 12A can be acquired from the clock signals TCK1 to TCK3 shown in FIG. 6.

That is, because of LO3=1 in FIG. 12A, the scan enable signal SE3 becomes the H-state. An edge defined by the last clock of the scan mode becomes the launch edge LE3, and the scan enable signal SE3 is changed from the H-state to the L-state by detecting this launch edge LE3. Since the mask signal EN3 is activated while the scan enable signal SE3 is in the L-state, the clocks are masked except the launch edge LE3 of the clock signal TCK3.

Because of LO1=0 and LO2=0, the scan enable signals SE1, SE2 become the L-state. Therefore, the launch edges LE1, LE2 are not detected from the clock signals TCK1, TCK2. The mask process same as the first embodiment is performed for masking the capture edges CE.

In this way, the launch edge LE3 is generated in the clock signal TCK3 that is captured into the clock domain CD3, which is the switching source; the capture edge CE3 is generated in the clock signal TCK3 that is captured into the clock domain CD3, which is the switching destination; and other clocks are hidden.

FIG. 12B is waveforms at the time of the same-domain verification from the clock domain CD2 to the clock domain CD2 (CD2→CD2).

In the case of the same-domain verification, the output terminal LO2 of the launch side decoder DEC1 is set to LO2=1, and the output terminal CO2 of the capture side decoder DEC2 is set to CO2=1. The clock signal CLK is input to the clock source CLK in this sate at the time of the scan mode to trigger the start of the delay failure test. In this way, the waveforms shown in FIG. 12B can be acquired from the clock signals TCK1 to TCK3 shown in FIG. 6.

That is, because of LO2=1 in FIG. 12B, the scan enable signal SE2 becomes the H-state. An edge defined by the last clock of the scan mode becomes the launch edge LE2, and the scan enable signal SE2 is changed from the H-state to the L-state by detecting this launch edge LE2. Since the mask signal EN2 is activated while the scan enable signal SE2 is in the L-state, the clocks are masked except the launch edge LE2 of the clock signal TCK2.

Because of L1=0 and LO3=0, the scan enable signals SE1, SE3 become the L-state. Therefore, the launch edges LE1, LE3 are not detected from the clock signals TCK1, TCK3. The mask process same as the first embodiment is performed for masking the capture edges CE.

In this way, the launch edge LE2 is generated in the clock signal TCK2 that is captured into the clock domain CD2, which is the switching source; the capture edge CE2 is generated in the clock signal TCK2 that is captured into the clock domain CD2, which is the switching destination; and other clocks are hidden.

FIG. 12C is waveforms at the time of the same-domain verification from the clock domain CD1 to the clock domain CD1 (CD1→CD1).

In the case of the same-domain verification, the output terminal LO1 of the launch side decoder DEC1 is set to LO1=1, and the output terminal CO1 of the capture side decoder DEC2 is set to CO1=1. The clock signal CLK is input to the clock source CLK in this sate at the time of the scan mode to trigger the start of the delay failure test. In this way, the waveforms shown in FIG. 12C can be acquired from the clock signals TCK1 to TCK3 shown in FIG. 6.

That is, because of LO1=1 in FIG. 12C, the scan enable signal SE1 becomes the H-state. An edge defined by the last clock of the scan mode becomes the launch edge LE1, and the scan enable signal SE1 is changed from the H-state to the L-state by detecting this launch edge LE1. Since the mask signal EN1 is activated while the scan enable signal SE1 is in the L-state, the clocks are masked except the launch edge LE1 of the clock signal TCK1.

Because of LO2=0 and LO3=0, the scan enable signals SE2, SE3 become the L-state. Therefore, the launch edges LE2, LE3 are not detected from the clock signals TCK2, TCK3. The mask process same as the first embodiment is performed for masking the capture edges CE.

In this way, the launch edge LE1 is generated in the clock signal TCK1 that is captured into the clock domain CD1, which is the switching source; the capture edge CE1 is generated in the clock signal TCK1 that is captured into the clock domain CD1, which is the switching destination; and other clocks are hidden.

In MODE 3, the launch edge LE and the capture edge CE are generated in the clock signals captured into the same clock domain CD and other clocks are hidden.

Therefore, the combination of the launch edge LE and the capture edge CE necessary for the verification of the same clock domain can be activated in a one-on-one relationship. Consequently, the skewed load mode can be applied to the failure detection without considerably changing the circuit configuration.

As described above, the delay failure test circuit can generate the launch edge and the capture edge only for the clock domains CD that are the targets of the delay failure test by masking clocks of clock domains other than the clock domains that are the targets of the delay failure test. Therefore, the launch edge can be correlated one-on-one with the capture edge. The launch edges LE or capture edges CE may be used, provided the timing is not affected.

In this way, the quality of LSI can be improved by facilitating the generation of the test pattern between the clock domains CD and improving the detection rate of the delay failure between the clock domains CD.

The present invention can be achieved without changing the clock configuration of the tested circuit (LSI 100, 700). Therefore, the present invention is also useful for the automatic insertion of the delay failure test circuit with a tool.

According to the embodiments described above, quality of LSI can be improved.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A delay failure test circuit with which a delay failure test between two clock domains among a plurality of clock domains having different operation clock rates is performed, wherein the delay failure test circuit is configured to input, to a first clock domain, a clock signal having only a launch edge for transferring data from the first clock domain to a second clock domain, and to input, to the second clock domain, a clock signal having only a capture edge for capturing the data, wherein the delay failure test circuit is configured to generate only a launch edge and a capture edge from each operation clock of the clock domains, and to align, when an operation clock rate of the first clock domain is lower than that of the second clock domain, launch edges generated, the launch edge in the clock signal input to the first clock domain is a launch edge acquired from the operation clock of the first clock domain, and the capture edge in the clock signal input to the second clock domain is a capture edge acquired from the operation clock of the second clock domain.

2. The delay failure test circuit according to claim 1, wherein among the launch edges generated, launch edges other than the launch edge acquired from the operation clock of the first clock domain are masked, and among the capture edges generated, capture edges other than the capture edge acquired from the operation clock of the second clock domain are masked.

3. The delay failure test circuit according to claim 1, wherein the launch edge acquired from the operation clock of the first clock domain is an edge of a final clock when the first clock domain is in a scan mode.

4. A delay failure test circuit with which a delay failure test between two clock domains among a plurality of clock domains having different operation clock rates is performed, wherein the delay failure test circuit is configured to input, to a first clock domain, a clock signal having only a launch edge for transferring data from the first clock domain to a second clock domain, and to input, to the second clock domain, a clock signal having only a capture edge for capturing the data, wherein the delay failure test circuit is configured to generate only a launch edge and a capture edge from each operation clock of the clock domains, and to align, when an operation clock rate of the first clock domain is higher than that of the second clock domain, capture edges generated, the launch edge in the clock signal input to the first clock domain is a launch edge acquired from the operation clock of the first clock domain, and the capture edge in the clock signal input to the second clock domain is a capture edge acquired from the operation clock of the second clock domain.

5. The delay failure test circuit according to claim 4, wherein among the launch edges generated, launch edges other than the launch edge acquired from the operation clock of the first clock domain are masked, and among the capture edges generated, capture edges other than the capture edge acquired from the operation clock of the second clock domain are masked.

6. The delay failure test circuit according to claim 4, wherein the launch edge acquired from the operation clock of the first clock domain is an edge of a final clock when the first clock domain is in a scan mode.

\* \* \* \* \*

UNITED STATES PATENT AND TRADEMARK OFFICE
CERTIFICATE OF CORRECTION

| | | |
|---|---|---|
| PATENT NO. | : 7,640,124 B2 | Page 1 of 1 |
| APPLICATION NO. | : 11/717769 | |
| DATED | : December 29, 2009 | |
| INVENTOR(S) | : Hideaki Konishi et al. | |

It is certified that error appears in the above-identified patent and that said Letters Patent is hereby corrected as shown below:

Title Page, item [74] Column 2 (Primary Examiner), Line 1, change "Carlos" to --Carol--.

Signed and Sealed this

Sixteenth Day of March, 2010

David J. Kappos
*Director of the United States Patent and Trademark Office*